United States Patent [19]

Reche

[11] Patent Number: 5,196,376

[45] Date of Patent: Mar. 23, 1993

[54] LASER LITHOGRAPHY FOR INTEGRATED CIRCUIT AND INTEGRATED CIRCUIT INTERCONNECT MANUFACTURE

[75] Inventor: John J. Reche, Phoenix, Ariz.

[73] Assignee: Polycon Corporation, Tempe, Ariz.

[21] Appl. No.: 662,748

[22] Filed: Mar. 1, 1991

[51] Int. Cl.$^5$ .................. H01L 21/302; H01L 21/268
[52] U.S. Cl. .................... 437/225; 437/173; 437/229
[58] Field of Search .................. 437/225, 229, 173

[56] References Cited

U.S. PATENT DOCUMENTS

| 4,180,614 | 12/1979 | Angelo | 428/336 |
|---|---|---|---|
| 4,764,485 | 8/1988 | Loughran et al. | 437/225 |
| 4,789,648 | 12/1988 | Chow et al. | 437/225 |

FOREIGN PATENT DOCUMENTS 0272799  6/1988  European Pat. Off.

Primary Examiner—Brian E. Hearn
Assistant Examiner—Linda J. Fleck
Attorney, Agent, or Firm—Blakely, Sokoloff, Taylor & Zafman

[57] ABSTRACT

A laser lithography process for semiconductor interconnect and semiconductor manufacture having the advantages of non-contact printing processes and being much faster than prior art laser lithography processes is disclosed. In accordance with the process, a metal layer to be patterned either for use as a patterned metal layer or as a mask for patterning a layer therebelow, such as a think polyimide layer, is first coated with a very thin layer of polymer evaporated as a monomer using a vapor deposition process. This provides a very thin layer of polymer over the metal layer, which thin polymer layer is readily and quickly patterned by laser to provide a mask for the subsequent chemical etching of the metal layer. The vapor deposited polymer layer, while being very thin and thus readily removed by laser, is also substantially fault free, thereby providing a high-quality mask for the chemical etching process free of any possible damage from ordinary sources such as mask aligners, etc., yet being readily removed when desired such as by way of example, by plasma etching thereof. Various methods and applications are disclosed.

17 Claims, 2 Drawing Sheets

LASER LITHOGRAPHY FOR INTEGRATED CIRCUIT AND INTEGRATED CIRCUIT INTERCONNECT MANUFACTURE

BACKGROUND OF THE INVENTION

1. Field of the Invention

The present invention relates to the field of electronic circuit fabrication.

2. Prior Art

The inventor's primary interest in the present invention relates to the fabrication of high density multichip interconnects (HDMIs), devices which typically receive a plurality of integrated circuits in unpackaged chip form and provides interconnects therefor so as to provide the functional equivalent of VLSI and wafer scale integration without the attendant problems thereof. Since similar processes are currently used and very similar problems are also encountered in the fabrication of integrated circuits themselves, the prior art relating to HDMI and integrated circuit fabrication will be described. It should be understood, however, that while the present invention is particularly useful in these two areas of electronics, the same is not necessarily so restricted.

In the fabrication of HDMIs and in semiconductor device manufacturing, typical processing includes the steps of depositing a metal layer and then patterning the same, either for providing an interconnecting layer in HDMIs and semiconductors, or in the case of HDMIs, for also providing a metal mask through which one or more polymer layers therebelow may be plasma etched. For this purpose, various techniques are well-known for patterning such metal layers, one of the most common being through the use of a contact printing process. In accordance with this process, the metal layer is coated with a photo resist, typically using spin-coating techniques, and then exposed through an appropriate mask laid over the semiconductor wafer. Thereafter, either the exposed or the unexposed portion of the photo resist, depending upon the type of photo resist used, is dissolved away, with the metal layer then being chemically etched through the openings in the photo resist to define the desired pattern. Such process provides good accuracy and is relatively easily carried out with standard equipment. However, damage to the photo resist layer and/or the mask can result when the mask is aligned as desired with respect to the wafer by the mask aligner prior to exposure of the photo resist layer, which damage may result in the fabrication of a faulty HDMI or semiconductor, or in the case of damage to the mask, subsequently produced products also until the mask is replaced.

Other techniques have also been used, such as by way of example, a very similar process wherein the mask is spaced safely away from the photo resist. These processes tend to eliminate the physical damage problem, though are less accurate than the contact printing process because of the severe limitations they impose on the exposure radiation. Still other non-contact exposure techniques are also known, though they too have similar strict requirements and limitations.

One technique that has been used, particularly in the fabrication of HDMIs, is to coat the metal layer with a relatively thick layer of polyimide, again typically by spin coating, and to remove the polyimide in the desired pattern by laser to expose local regions of the metal layer therebelow for subsequent chemical etching. Depending upon the process, it may be desired to remove one or more layers of polyimide therebelow also, in which case after the metal layer is patterned as described, the polyimide regions exposed therebelow may be plasma etched to remove the polyimide in the desired pattern. In any event, the portions of the polyimide layer not removed by the laser must provide a high integrity mask for the subsequent chemical etching of the metal layer, as the slightest pinhole in the polyimide may result in a pinhole in the metal layer therebelow, resulting in the plasma etching of a pinhole in the polyimide layer under the metal layer, ultimately resulting in a short between metal layers when a subsequent metal layer is deposited thereover. To provide the required integrity in the polymer layer as a masking layer, the polymer layer must be relatively thick, typically being on the order of ten microns thick. While such layers may be patterned by lasers as desired, the process is time consuming and relatively expensive, as the laser must be repetitively pulsed at each point (pixel) in the pattern a relatively large number of times to reliably remove the polyimide layer at that location. Further, increasing the power of the laser has little effect on the material removal rate because the opaqueness of the polymer to the laser light confines the material removal to the surface region thereof anyway. Also, because the laser creates such straight and sharp edges in the openings created through the thick polyimide layer, a subsequent metallization layer will have very poor coverage at the resulting top sharp edges and bottom corners. In comparison, plasma etching yields a tapered wall, giving a much more uniform thickness in the subsequent metallization layer. Also, the sharp corners left by the laser subsequently result in poor photoresist coverage at the sharp corners, thereby causing early breakdown when etching.

Also well known in the prior art are vapor deposition techniques for depositing layers of various materials. See for instance U.S. Pat. Nos. 3,342,754 and 3,288,728. One such technique comprises the heating of a monomer in a vacuum chamber to boil off the monomer, with the same depositing as a polymer onto the surface of the desired articles in the same vacuum chamber. This process, by way of example, has been used to protect finished printed circuit boards against water absorption by the deposition of polymers on the order of 0.001 to 0.002 inches thick.

BRIEF SUMMARY OF THE INVENTION

A laser lithography Process for semiconductor interconnect and semiconductor manufacture having the advantages of non-contact printing processes and being much faster than prior art laser lithography processes is disclosed. In accordance with the process, a metal layer to be patterned either for use as a patterned metal layer or as a mask for patterning a layer therebelow, such as a thick polyimide layer, is first coated with a very thin layer of polymer evaporated as a monomer using a vapor deposition process. This provides a very thin layer of polymer over the metal layer, which thin polymer layer is readily and quickly patterned by laser to provide a mask for the subsequent chemical etching of the metal layer. The vapor deposited polymer layer, while being very thin and thus readily removed by laser, is also substantially fault free, thereby providing a high-quality mask for the chemical etching process free of any possible damage from ordinary sources such as mask aligners, etc., yet being readily removed when desired such as by way of example, by plasma etching thereof. Various methods and applications are disclosed.

DETAILED DESCRIPTION OF THE INVENTION

Figure 1:
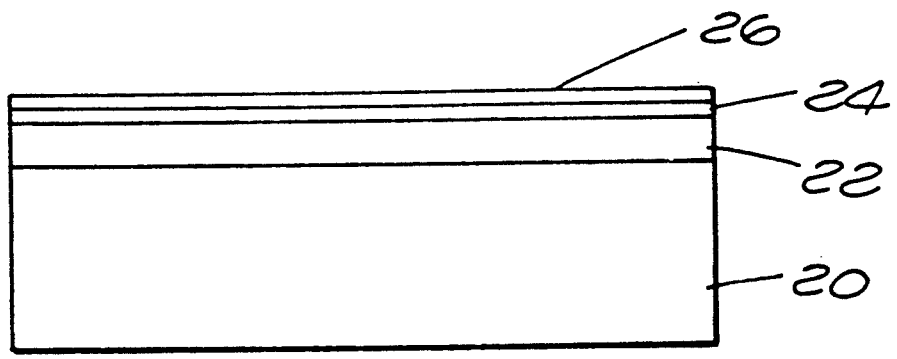
FIG. 1 is a schematic cross section of a part of a high-density multichip interconnect at a partial stage of fabrication thereof, illustrating the vapor deposited thin polymer thereon.

First referring to FIG. 1, a schematic cross section of a local area of a high density multichip interconnect at a partial stage of fabrication may be seen. Multichip interconnect devices are fabricated on a substrate 20 which may be conductive, semi-conductive, or non-conductive depending upon the substrate material used. If non-conductive or semi-conductive, generally the same will be first covered with a conductive layer to form a ground plane above which the interconnect circuitry is fabricated. In any event, typically above the ground plane, whether formed by the conductive substrate itself or a conductive layer thereon, is usually provided a thick layer of polyimide 22 which is to be patterned to allow local access to the ground plane for making contact therewith. This example, of course, is exemplary only, as typically high-density multichip interconnects are formed by putting down alternate layers of thick polyimide (or other thick layers of organic or inorganic insulators) and thin metal layers, both being patterned at appropriate stages in the fabrication to allow the selective interconnection of the conductive layers through windows formed in the thick polyimide layers.

In any event, in accordance with the present invention, the thick polyimide layer to be patterned, such as layer 22, is first covered by a metal or other etch resistant layer 24 not etched by the same plasma gas as the underlying material using conventional deposition techniques such as by evaporation, CVD, sputtering or other means. (Thick polymer layers, unless stated otherwise, are typically in the range of one to twenty five microns in thickness.) Thereafter a thin layer of polymer 26 is deposited to the metal layer 24 in such a manner as to provide a very thin, yet substantially pinhole-free layer over the metal layer. In particular, layer 26 is deposited using a vapor deposition technique whereby a monomer is heated in a vacuum to vaporize the same, to be deposited out as a substantially polymeric layer on adjacent parts to form layer 26. Such a vapor deposition process provides a high integrity, substantially pinhole-free coating, even in very small thicknesses, suitable for use after patterning as a mask material for the subsequent chemical etching of the metal layer. In the preferred embodiment of the present invention, the layer 26 is approximately 200 to 1000 Angstroms thick, with the useful thickness being bounded on the upper end by a thickness requiring a substantial dwell time to be removed by a conventional laser and on the lower end by a thickness below which the same will not provide an adequate mask capability for the required etchants and etching times to remove the metal therebelow through one or more openings formed in the layer 26. In the preferred embodiment, a paraxylylene monomer manufactured by Union Carbide is used, though other suitable materials are available for such purpose.

Figure 2:
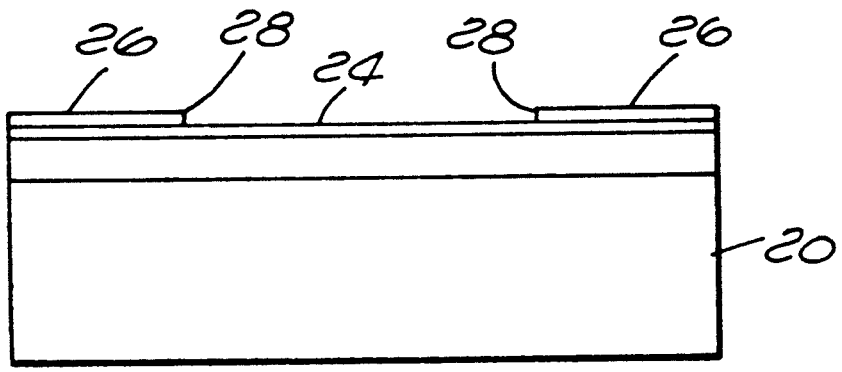
FIG. 2 is a schematic cross section similar to FIG. 1 after the vapor deposited thin polymer layer thereon has been patterned.

After layer 26 has been deposited, the same is removed in local areas by laser, as shown in FIG. 2. Use of the laser allows very accurate drawing of the desired pattern under computer control, and because the layer 26 is very thin, the material desired to be removed may readily be removed by the laser in a rapid and efficient manner, normally requiring only one or two pulses of the laser at each "pixel" of the region for which the material of layer 26 is to be removed. In general, the laser pulses can be less than 20 nanoseconds in duration, so that the laser may be moved in a raster scan fashion without stopping at each pixel without causing any substantial blur at the edges. Thus, unlike the prior art, the thin polymer layer 26 may be patterned in a matter of seconds rather than on the order of an hour or more as required by the prior art.

Once layer 26 is patterned, the metal layer 24 thereunder may readily be patterned in a corresponding pattern by conventional chemical etching techniques. In that regard, while the laser cutting of layer 26 provides a very sharp and straight edge 28 on the opening cut therein, the chemical etching of the metal layer 24 thereunder may readily be achieved essentially right up to the edge of the opening in polymer layer 26, as the very thin polymer layer provides substantially no shading of the adjacent exposed metal layer, allowing the etching to be active and effective substantially right up to the edge of the opening.

Figure 3:
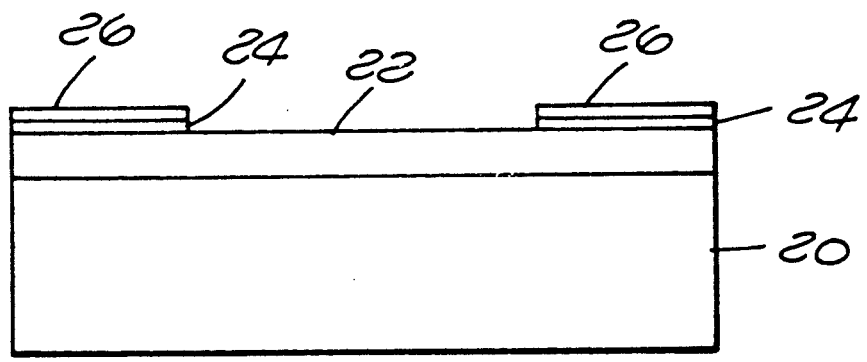
FIG. 3 is a schematic cross section similar to FIG. 2 after the metal or other etch resistant layer under the thin polymer layer has been etched in the pattern defined by the patterned thin polymer layer.
Figure 4:
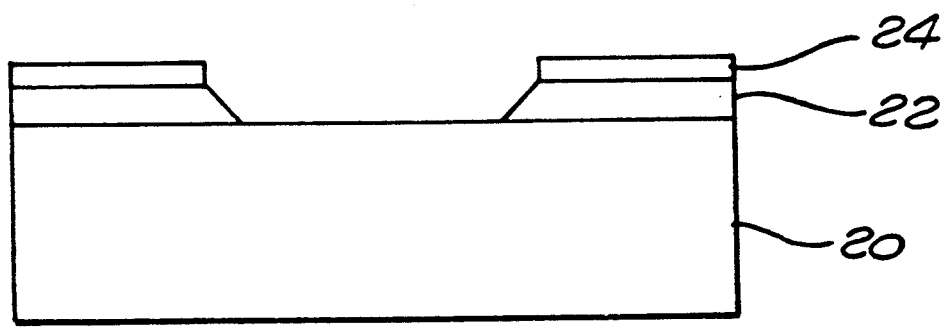
FIG. 4 is a schematic cross section similar to FIG. 3 after the thick polymer layer has been plasma etched through the patterned metal layer, during which time the thin polymer layer thereover is also removed.

Once the metal layer 24 has been patterned as desired a plasma etching step is carried out to remove the now exposed portions of the thick polymer layer 22 (see FIGS. 3 and 4). At the same time the remaining portions of layer 26 are also removed by the plasma etch, with the patterned metal layer 24 providing a stop or mask for the plasma etch to prevent removal of any of the thick polyimide layer therebelow.

The present invention has a number of advantages over the prior art techniques. First, the process is a non-contact printing process and therefore eliminates the possibility of damaging the masking layer (the thin layer of polyimide) by sliding a mask thereover during the alignment process. Further, the process is fast, as the usual photolithographic steps of exposing a photo resist and developing the same to remove the desired portions thereof are accomplished in the single laser scanning step. Further, while the process is highly suitable for high production volumes, it also has advantages in prototyping and small production runs because of its versatility. In particular, the fabrication of original mask sets is time consuming and relatively expensive, with the subsequent incorporation of any required changes during the development phase similarly being time consuming and expensive. The technique of the present invention, however, being a direct process under computer control, allows the relatively easy generation of new patterns for fabrication of the new and improved layers, and the quick and easy change thereof to fabricate the new products with optimized manufacturability and/or performance of the circuit.

Of course, while the invention has been described herein with respect to the patterning of a thick polymer layer, such process obviously involves the patterning of a metal layer which in some applications may in itself be the end result desired, such as by way of example, the patterning of the metal interconnect layer in integrated circuit fabrication.

Figure 5:
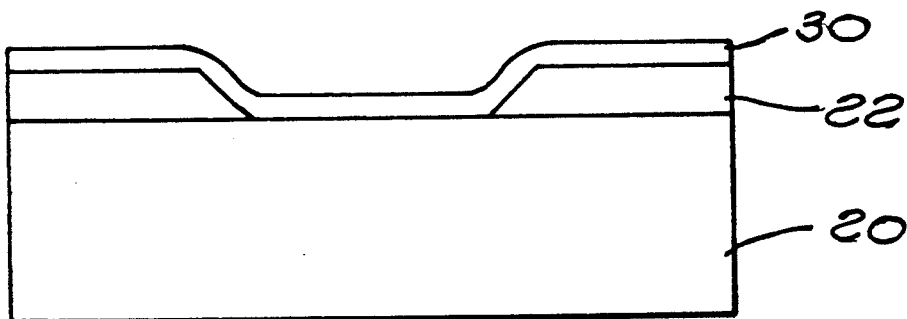
FIG. 5 illustrates the even and smooth configuration of a metal layer over the thick polymer layer etched in accordance with the present invention.
Figure 6:
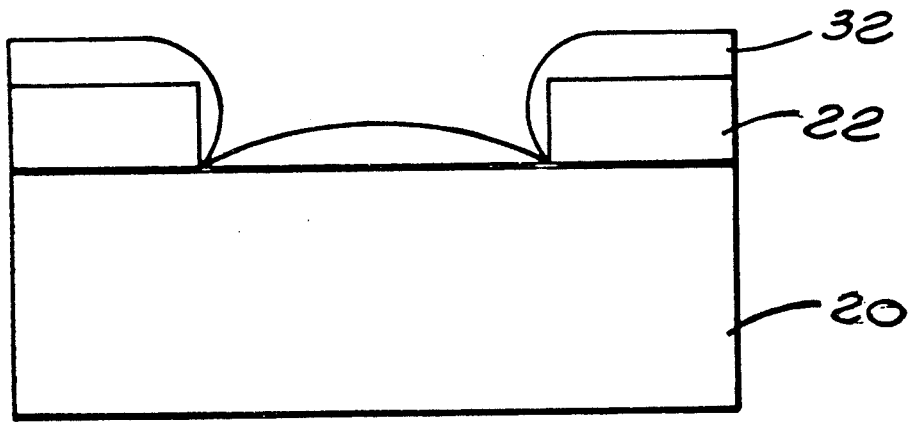
FIG. 6 shows the thinning out of a metal layer over the right angled edges of the thick polymer layer etched in accordance with the prior art.

Some advantages of the present invention are perhaps best illustrated by illustrating prior efforts and comparing the results thereof shown in FIG. 6 with the results of the present invention shown in FIGS. 4 and 5. Referring again to FIG. 4, it is shown that because of the fact that the polyimide layer 22 is removed by the generally isotropic process of plasma etching, the edges of layer 22 are sloped and meet the surface of the substrate 20 with a smooth transition. Therefore, as illustrated in FIG. 5, after the metal mask 24 is removed and a new metal layer 30 is deposited over the polyimide layer in order to make contact with the substrate 20, the thickness of the metal layer 30 over the polyimide layer throughout the sloped step thus created by plasma etching of the polyimide layer 22 remains relatively constant. Thus, no possibility of a break in the metal layer 30 in the region of the step exists. Hence, the present invention avoids the "step coverage" problem associated with the prior art as illustrated in FIG. 6. As depicted in FIG. 6, even when a laser beam technology is utilized, a "step coverage" problem persists in the prior art. In other words, when a laser beam is employed for directly carving a pattern on the polyimide layer 22, the abrupt steps in layer 22 are inevitable since, contrary to the present invention, no isotropic plasma etching follows. Because the polyimide layer is generally one to twenty five microns thick, the step thus created by the laser beam is both abrupt and very deep for deposition of a metal layer 32 which is typically as thin as one micron. Thus, the metal layer 32 spreads too thin over the right angled edges of the polyimide step, in turn resulting in short term breakage of the metal line in the region of the right angled step. Even if the metal line survives a short term breakage, metal migration problems (natural thinning out and eventual breakage of metal layers due to electric currents) will first manifest themselves in the thin regions of the metal over the polyimide right angled step. This in turn causes an early breakage of the metal layer over the step. Thus, for the foregoing reasons, while laser patterning for masking purposes has been attempted, the same is not in widespread use because of the various problems associated therewith.

In the embodiments described herein, the thin layer of polymer is removed in the desired pattern by direct control of the laser without the use of a mask. As an alternative, a laser may be raster scanned over a shadow mask (a non-contact mask) adjacent to the workpiece so that the pattern in the thin polyimide layer on the workpiece is defined by the mask, not on-off control of the laser, with the thin layer of course still being directly removed by the laser where not blocked by the mask. Further of course, alternate selective etching processes may be used, and the processes of the present invention may also be used to form patterns in layers other than metal layers, such as for example, oxide and other layers wherein selective etching may still be used between the layer to be removed (patterned) and the masking (polyimide) layer.

While the present invention has been disclosed and described here and with respect to the preferred embodiments thereof, it will be understood by those skilled in the art to various changes in form and detail may be made therein without departing from the spirit or the scope thereof.

I claim:

1. A method of patterning a layer of metal during the fabrication of a microelectronic circuit comprising the steps of:
   (a) vapor depositing a layer of polymer having a thickness of approximately 200 to 1000 Angstroms onto the layer of metal by vaporizing a corresponding monomer in a vacuum and allowing the same to deposit onto the layer of metal substantially as a polymer;
   (b) patterning the thin layer of polymer to expose corresponding areas of the metal layer thereon by removing the same in selected areas with a laser; and,
   (c) selectively etching the exposed areas of the metal layer to pattern the metal layer in accordance with a pattern defined by the thin layer of polymer.

2. The method of claim 1 wherein the thin layer of polymer is a paraxylylene compound.

3. A method of forming a patterned layer of metal during the fabrication of a microelectronic circuit comprising the steps of:
   (a) depositing the layer of metal onto a partially completed microelectronic circuit;
   (b) vapor depositing a layer of polymer having a thickness of approximately 200 to 1000 Angstroms onto the layer of metal by vaporizing a corresponding monomer in a vacuum and allowing the same to deposit onto the layer of metal substantially as a polymer;
   (c) pattering the thin layer of polymer to expose corresponding areas of the metal layer therebeneath by removing the same in selected areas with a laser; and,
   (d) chemical etching the exposed areas of the metal layer to pattern the metal layer in accordance with a pattern defined by the thin layer of polymer.

4. The method of claim 3 wherein the thin layer of polymer is a paraxylylene compound.

5. A method of patterning a thick layer of polymer during the fabrication of a microelectronic circuit comprising the steps of:
   (a) depositing a layer of metal onto the thick layer of polymer;
   (b) vapor depositing a layer of polymer having a thickness of approximately 200 to 1000 Angstroms onto the layer of metal by vaporizing a corresponding monomer in a vacuum and allowing the same to deposit onto the layer of metal substantially as a polymer;
   (c) patterning the thin layer of polymer to expose corresponding areas of the metal layer therebeneath by removing the same in selected areas with a laser;
   (d) chemical etching the exposed areas of the metal layer to remove parts of the metal layer to expose areas of the thick polymer layer therebeneath in accordance with the pattern defined by the thin layer of polymer; and, (e) plasma etching the thick layer of polymer in the regions exposed by removal of the metal layer therefrom.

6. The method of claim 5 wherein the thick layer of polymer is a polyimide layer.

7. The method of claim 5 or 6 wherein the thin layer of polymer is a paraxylylene compound.

8. The method of claim 5 or 6 wherein the thin layer of polymer is a paraxylylene compound having a thickness of approximately 200 to 1000 Angstroms.

9. A method of forming a patterned thick layer of polymer during the fabrication of a microelectronic circuit comprising the steps of:

(a) forming a thick layer of polymer on a partially completed microelectronic circuit;

(b) depositing a layer of metal onto the thick layer of polymer;

(c) vapor depositing a thin layer of polymer onto the layer of metal by vaporizing a corresponding monomer in a vacuum and allowing the same to deposit onto the layer of metal substantially as a polymer;

(d) patterning the thin layer of polymer to expose corresponding areas of the metal layer therebeneath by removing the same in selected areas with a laser;

(e) chemical etching the exposed areas of the metal layer to remove parts of the metal layer to expose areas of the thick polymer layer therebeneath in accordance with the pattern defined by the thin layer of polymer; and, (f) plasma etching the thick layer of polymer in the regions exposed by removal of the metal layer therefrom.

10. The method of claim 9 wherein the thick layer of polymer is a polyimide layer.

11. The method of claims 9 or 10 wherein the thin layer of polymer has a thickness of approximately 200 to 1000 Angstroms.

12. The method of claim 9 or 10 wherein the thin layer of polymer is a paraxylylene compound.

13. The method of claim 9 or 10 wherein the thin layer of polymer is a paraxylylene compound having a thickness of approximately 200 to 1000 Angstroms.

14. A method of patterning a layer during the fabrication of a microelectronic circuit comprising the steps of:

(a) vapor depositing a thin layer of polymer onto the layer to be patterned by vaporizing a corresponding monomer in a vacuum and allowing the same to deposit onto the layer to be patterned substantially as a polymer;

(b) patterning the thin layer of polymer to expose corresponding areas of the layer to be patterned therebeneath by removing the same in selected areas with a laser; and, (c) selectively etching the exposed areas of the layer to be patterned to pattern the layer in accordance with a pattern defined by the thin layer of polymer.

15. The method of claim 14 wherein the thin layer of polymer has a thickness of approximately 200 to 1000 Angstroms.

16. The method of claim 14 wherein the thin layer of polymer is a paraxylylene compound.

17. The method of claim 14 wherein the thin layer of polymer is a paraxylylene compound having a thickness of approximately 200 to 1000 Angstroms.

* * * * *